United States Patent
Ozoe et al.

(10) Patent No.: US 7,859,023 B2
(45) Date of Patent: Dec. 28, 2010

(54) STANDARD CELL AND SEMICONDUCTOR DEVICE INCLUDING THE SAME

(75) Inventors: Ritsuko Ozoe, Osaka (JP); Hiroki Taniguchi, Kyoto (JP); Hidetoshi Nishimura, Osaka (JP); Masaki Tamaru, Kyoto (JP); Hideaki Kondo, Kyoto (JP)

(73) Assignee: Panasonic Corporation, Osaka (JP)

( * ) Notice: Subject to any disclaimer, the term of this patent is extended or adjusted under 35 U.S.C. 154(b) by 267 days.

(21) Appl. No.: 12/098,035

(22) Filed: Apr. 4, 2008

(65) Prior Publication Data

US 2008/0246160 A1      Oct. 9, 2008

(30) Foreign Application Priority Data

Apr. 5, 2007    (JP) .............................. 2007-099437

(51) Int. Cl.
    *H01L 27/10*    (2006.01)
(52) U.S. Cl. ...................... 257/208; 257/207; 257/209; 257/E27.06
(58) Field of Classification Search ......... 257/206–208, 257/368, 655, 773, 758
See application file for complete search history.

(56) References Cited

U.S. PATENT DOCUMENTS

| 6,812,574 | B2 | 11/2004 | Tomita et al. | |
| 2002/0063335 | A1* | 5/2002 | Ozawa et al. | 257/758 |
| 2003/0039897 | A1* | 2/2003 | Morita | 430/5 |

FOREIGN PATENT DOCUMENTS

| JP | 09-120993 | 5/1997 |
| JP | 2006-235080 | 9/2006 |

OTHER PUBLICATIONS

Kotani et al. "New Design and OPC Flow for Manufacturability for 45 nm Node and Beyond", VLSI Symposium, 2005.

* cited by examiner

*Primary Examiner*—Dung A. Le
(74) *Attorney, Agent, or Firm*—McDermott Will & Emery LLP

(57) ABSTRACT

This invention prevents a break in a signal wire disposed between wire ends due to attenuation and improves production yields of devices. In a standard cell, a first signal wire extends in a first direction. Second and third signal wires extend in a second direction substantially perpendicular to the first direction and are facing each other across the first signal wire. The second and third signal wires have the widths larger than the width of the first signal wire.

4 Claims, 5 Drawing Sheets

STANDARD CELL AND SEMICONDUCTOR DEVICE INCLUDING THE SAME

CROSS-REFERENCE TO RELATED APPLICATIONS

This application claims priority under 35 U.S.C. §119(a) on Japanese Patent Application No. 2007-099437 filed on Apr. 5, 2007, the entire contents of which are hereby incorporated by reference.

BACKGROUND OF THE INVENTION

1. Field of the Invention

The present invention relates to a semiconductor device including a standard cell, and particularly to a wiring pattern structure of a standard cell suitable for microfabrication processes.

2. Description of the Prior Art

Conventionally, layouts of semiconductor integrated circuits are designed by disposing circuit elements called standard cells. A standard cell is to realize a functional block, such as an AND gate, an OR gate, and a flip-flop (FF), and has the internal wiring pattern designed in advance. In standard cell type LSI design, standard cells registered in a library are generally aligned in rows and wired using channels between the rows to realize a desired LSI.

In recent years, semiconductor production techniques made quite a progress, and microfabrication was further developed. Such microfabrication was realized by the extraordinary progress in micropattern forming techniques, such as mask processing, photolithography, and etching.

During the time when pattern sizes were sufficiently large, approximately perfect design patterns used to be successfully formed on wafers by forming a mask pattern accurate for a design pattern, transferring the mask pattern on a wafer by a projection optical system, and etching an underlying layer. The advance in pattern microfabrication, however, made it difficult to form accurate patterns in each process, and a problem arose that the final product dimensions were not same as the design.

In order to solve the problem, considering a conversion difference in each process, a process known as mask data preparation is extremely important for forming a mask pattern different from a design pattern so as to make the final product dimensions equal to the design pattern dimensions. Examples of such mask data preparation include MDP (Mask Data Processing) for modifying a mask pattern using, for example, graphical operations or a design rule checker (DRC) and OPC (Optical Proximity Correction) for correcting the optical proximity effects (OPE). Such processes appropriately correct a mask pattern to obtain desired final product dimensions.

Patent Document 1: JP9-120993 A

Patent Document 2: JP2006-235080 A

Non-Patent Document 1: Toshiya Kotani et al., "New Design and OPC Flow for Manufacturability for 45 nm Node and Beyond", VLSI symposium 2005.

In recent years, with further advanced microfabrication, the value of k1 in a lithography process (k1=W/(NA/λ), W denotes the design pattern size, λ denotes the exposure wavelength of an exposure device, and NA denotes the numerical aperture of a lens used in the exposure device) was more reduced. Because OPE is, thus, likely to be increased more, workload for OPC is extremely increased. Even more advanced microfabrication results in insufficient correction by OPC, and the gap between a design pattern and final product dimensions is increased.

Particularly, in 45 nm or finer processing, some wiring patterns are difficult to be controlled for mask correction by OPC. That is, as shown in FIG. 10, a wire X disposed between facing ends of wires is likely to be attenuated in the sandwiched part due to light interference during exposure. There is a high risk of breaking the wire due to such attenuation, and thus the production yields of devices cannot be secured sufficiently.

SUMMARY OF THE INVENTION

An object of the present invention is to provide a standard cell, in a semiconductor production process of advanced microfabrication, including a wiring pattern structure which does not develop a break due to attenuation in a wire disposed between facing ends of wires.

The first aspect of the present invention is a standard cell for forming a semiconductor device, the standard cell having a wiring pitch of 170 nm or less, including: a first signal wire formed in a first wiring layer and extended in a first direction; and second and third signal wires formed in the first wiring layer and extended in a second direction substantially perpendicular to the first direction, the second and third signal wires facing each other across the first signal wire. At least one of the second and third signal wires has a width larger than a width of the first signal wire.

According to this invention, since at least one of the second and third wires, facing each other across the first signal wire, has a wider width and the amount of regression in wire ends is reduced, the amount of OPC is also reduced to inhibit light interference to the interposed first signal wire during exposure. Attenuation of the first signal wire is thus prevented.

The second aspect of the present invention is a standard cell for forming a semiconductor device, the standard cell having a wiring pitch of 170 nm or less, including: a first signal wire formed in a first wiring layer and extended in a first direction; second and third signal wires formed in the first wiring layer and extended in a second direction substantially perpendicular to the first direction, the second and third signal wires facing each other across the first signal wire; a fourth signal wire formed in the first wiring layer and extended in the first direction; and a fifth signal wire formed in the first wiring layer and extended in the second direction, the fifth signal wire being adjacent to the fourth signal wire. At least one of a space between the first signal wire and an end of the second signal wire and a space between the first signal wire and an end of the third signal wire is larger than a space between the fourth signal wire and an end of the fifth signal wire.

According to this invention, since the space between one end of at least one of the second and third signal wires and the first signal wire disposed between them is enlarged, light interference to the first signal wire during exposure is inhibited. Attenuation in the first signal wire is thus prevented.

The third aspect of the present invention is a standard cell for forming a semiconductor device, the standard cell having a wiring pitch of 170 nm or less, including: a first signal wire formed in a first wiring layer and being adjacent to a cell border, the first signal wire extended in parallel with the cell border; and a second signal wire formed in the first wiring layer. The first signal wire has a width larger than a width of the second signal wire.

According to this invention, since the width of the first signal wire extended in parallel with the cell border is wider, a break in the wire due to attenuation is prevented even in a case where the first signal wire is disposed between a signal wire in the standard cell and a signal wire in an adjacent standard cell and even when light interference is developed during exposure.

The fourth aspect of the present invention is a standard cell for forming a semiconductor device, the standard cell having a wiring pitch of 170 nm or less, including: a first signal wire formed in a first wiring layer and being adjacent to a cell border, the first signal wire extended in a direction perpendicular to the cell border; and a second signal wire formed in the first wiring layer. The first signal wire has a width larger than a width of the second signal wire.

According to this invention, since the width of the first signal wire extended in a direction perpendicular to the cell border is wider, light interference during exposure is inhibited even in a case where the signal wire in the adjacent standard cell is disposed between the first signal wire and another signal wire in the adjacent standard cell. Attenuation of the signal wire in the adjacent standard cell is prevented.

As described above, the present invention prevents a break in a wire disposed between facing ends of wires due to attenuation, where such a wire was difficult to be controlled for mask correction in a semiconductor production process of advanced microfabrication, such as 45 nm or finer processing. This invention thus improves device production yields.

DESCRIPTION OF THE PREFERRED EMBODIMENTS

Hereinafter, embodiments of the present invention are described with reference to the drawings.

First Embodiment

Figure 1:
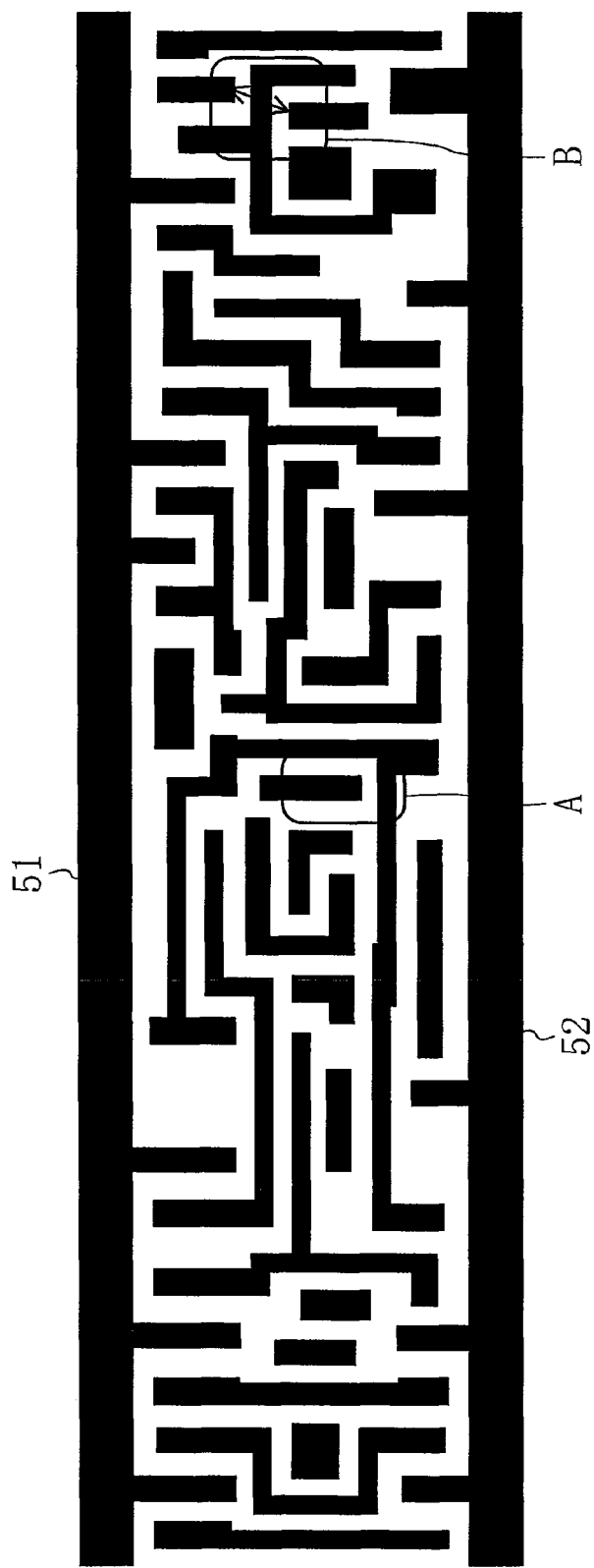
FIG. 1 is an example of a wiring pattern of a standard cell included in a semiconductor device according to an embodiment of the present invention.

FIG. 1 is an example of a wiring pattern of a standard cell included in a semiconductor device according to an embodiment of the present invention. FIG. 1 illustrates a wiring pattern in a certain wiring layer. At the upper and lower ends, power lines 51 and 52 are laid out horizontally.

Figure 2:
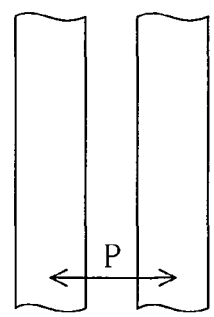
FIG. 2 is a diagram for illustrating a wiring pitch.

Each embodiment of the present invention is supposed to employ 45 nm or finer processing. In 45 nm or finer processing, wiring pitch P as shown in FIG. 2, i.e. the center-to-center distance between the wires, is equal to or less than 170 nm. That is, the present invention is based on the premise that the wiring pitch is equal to or less than 170 nm.

In the present invention, a "signal wire" is defined as a wire other than the wires connected to the power lines. In each drawing, the first direction is defined as a lateral direction, and the second direction substantially perpendicular to the first direction is defined as a vertical direction.

Figure 3:
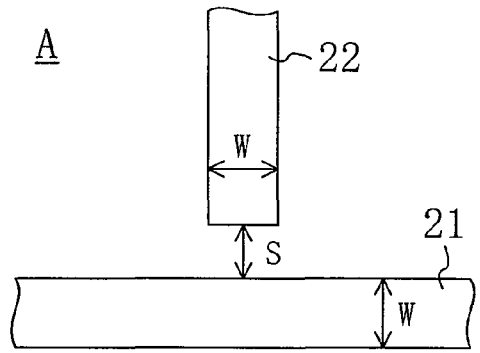
FIG. 3 is a magnified view of the wiring pattern A in FIG. 1.

FIG. 3 is a magnified view of the wiring pattern A in FIG. 1. As shown in FIG. 3, a signal wire 21 extends in the lateral direction, and an end of a signal wire 22 extending in the vertical direction is adjacent to the signal wire 21. The width of the signal wires 21 and 22 is denoted by W, and the space between the signal wire 21 and the end of the signal wire 22 is denoted by S.

Figure 4:
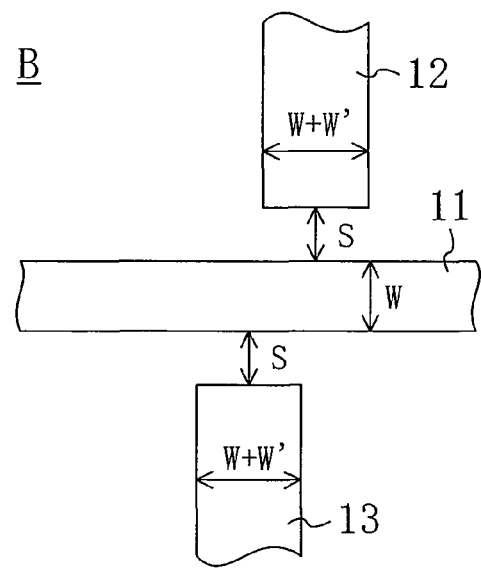
FIG. 4 is a diagram illustrating a wiring pattern of the first embodiment.

FIG. 4 is a magnified view of the wiring pattern B in FIG. 1 and illustrates a wiring pattern in this embodiment. As shown in FIG. 4, a signal wire 11 (first signal wire) extends in the lateral direction. Signal wires 12 and 13 (second and third signal wires) extend in the vertical direction and face each other across the signal wire 11.

In the present invention, "two signal wires facing each other" means that the two signal wires are disposed as if they would have an overlap when viewed in a direction the signal wires extend.

The signal wires 12 and 13 have an enlarged width of W+W', which is wider than width W of the signal wire 11. By widening the width of the signal wires 12 and 13 facing each other across the signal wire 11, the amount of regression at the wire ends is reduced to reduce the amount of OPC, and thus the light interference to the interposed signal wire 11 during exposure is inhibited. Accordingly, attenuation of the signal wire 11 is prevented. In this case, the signal wires 12 and 13 preferably have the largest width among the signal wires in the standard cell.

Figure 5:
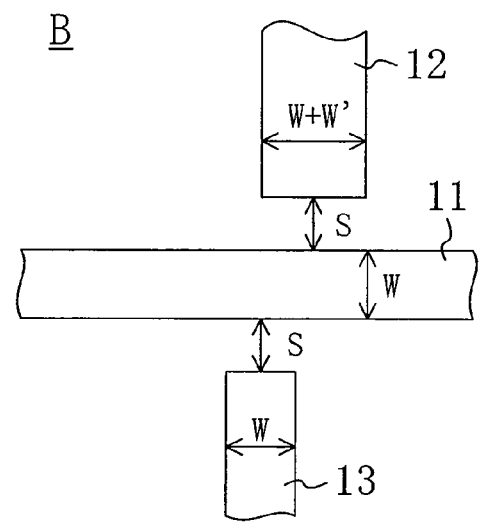
FIG. 5 is a diagram illustrating another example of the wiring pattern according to the first embodiment.

Although both signal wires 12 and 13, with the signal wire 11 interposed between them, have the enlarged widths in the example of FIG. 4, it may be only either one of the signal wires 12 and 13 to have the enlarged width. In the example of FIG. 5, only the signal wire 12 has the enlarged width of W+W'. In this case, too, light interference to the interposed signal wire 11 during exposure is inhibited to prevent attenuation of the signal wire 11. In this case, the signal wire 12 preferably has the largest width among the signal wires in the standard cell.

Second Embodiment

Figure 6:
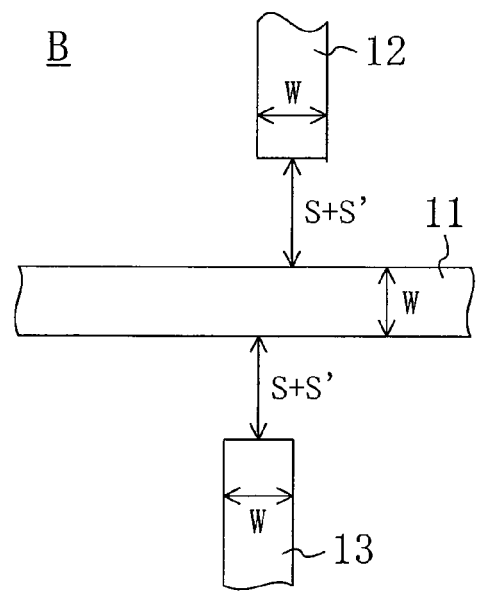
FIG. 6 is a diagram illustrating a wiring pattern of the second embodiment.

FIG. 6 is a diagram illustrating an improved example, according to this embodiment, of the wiring pattern B in FIG. 1. In FIG. 6, a space between the signal wire 11 and an end of the signal wire 12 is enlarged to S+S'. A space between the signal wire 11 and an end of the signal wire 13 is also enlarged to S+S'. Compared to the wiring pattern A shown in FIG. 3, the space between the signal wire 11 and the end of the signal wire 12 and the space between the signal wire 11 and the end of the signal wire 13 are larger than the space S between the signal wire 21 (fourth signal wire) and the end of the signal wire 22 (fifth signal wire).

By enlarging the spaces between the interposed signal wire 11 and the ends of the two signal wires 12 and 13 facing each other across the signal wire 11, light interference to the signal wire 11 during exposure is inhibited to prevent attenuation of the signal wire 11.

Figure 7:
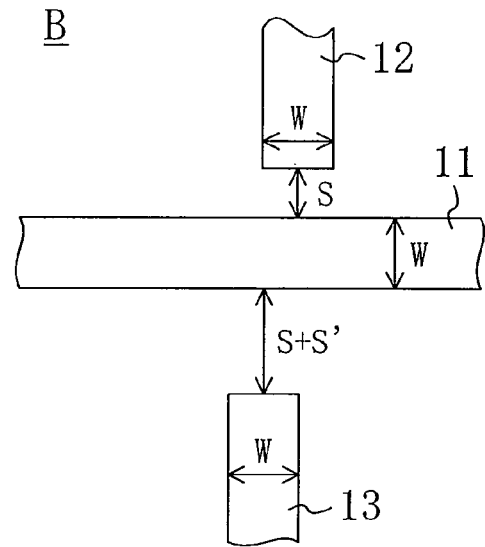
FIG. 7 is a diagram illustrating another example of the wiring pattern according to the second embodiment.

Although in the example of FIG. 6, both the signal wires 12 and 13, with the signal wire 11 interposed between them, have enlarged spaces between the signal wire 11 and each end of them, it may be only one end of either of the signal wires 12 and 13 to have an enlarged space between the signal wire 11 and the corresponding end. In the example of FIG. 7, only the signal wire 13 has an enlarged space of S+S' between the end and the signal wire 11. In this case, too, light interference to the interposed signal wire 11 during exposure is inhibited to prevent attenuation of the signal wire 11.

In this embodiment, similar to the first embodiment, at least one of the signal wires 12 and 13, with the signal wire 11 interposed between them, also may have an enlarged width. Such structure further inhibits light interference to the interposed signal wire 11 during exposure.

Third Embodiment

Any signal wire adjacent to a cell border of a standard cell also has a risk of developing attenuation of the wire or causing attenuation of a signal wire in an adjacent standard cell, depending on the wiring pattern of the adjacent standard cell. In this embodiment, the width of a signal wire adjacent to the cell border is made larger than that of other signal wires.

Figure 8:
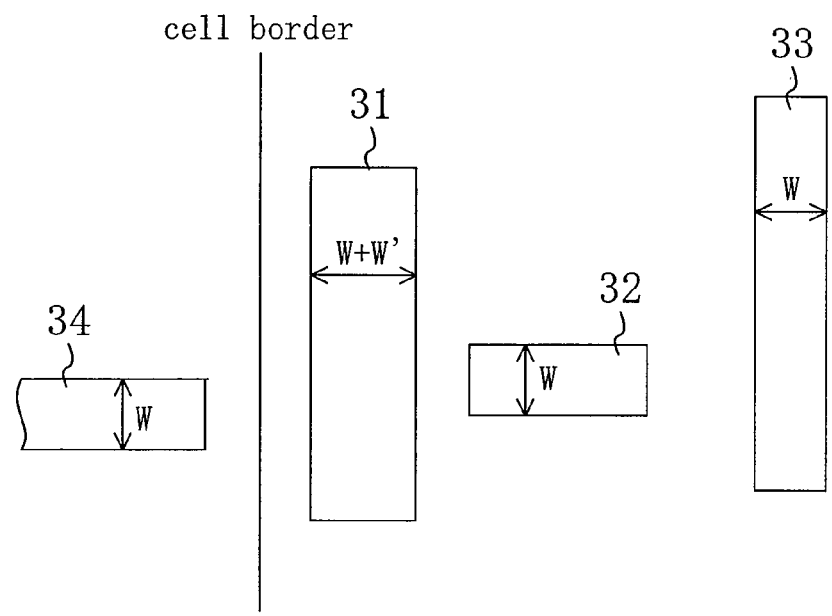
FIG. 8 is a diagram illustrating a wiring pattern of the third embodiment.

FIG. 8 is a diagram illustrating a wiring pattern in the vicinity of a cell border according to this embodiment. FIG. 8 shows a wiring pattern in a certain wiring layer. In FIG. 8, a signal wire 31 (first signal wire) is adjacent to a cell border and extends in parallel with the cell border. The signal wire 31 has an enlarged width of W+W'. That is, the signal wire 31 has the width larger than the width of other signal wires, such as a signal wire 33 (second signal wire). The signal wire 31 preferably has the largest width among the signal wires in the standard cell.

With this structure, even in a case where the signal wire 31 is disposed between a signal wire 34 in an adjacent standard cell and the signal wire 32 and even when light interference is developed during exposure, a break due to attenuation of the wire is prevented because the signal wire 31 has a wider width.

Figure 9:
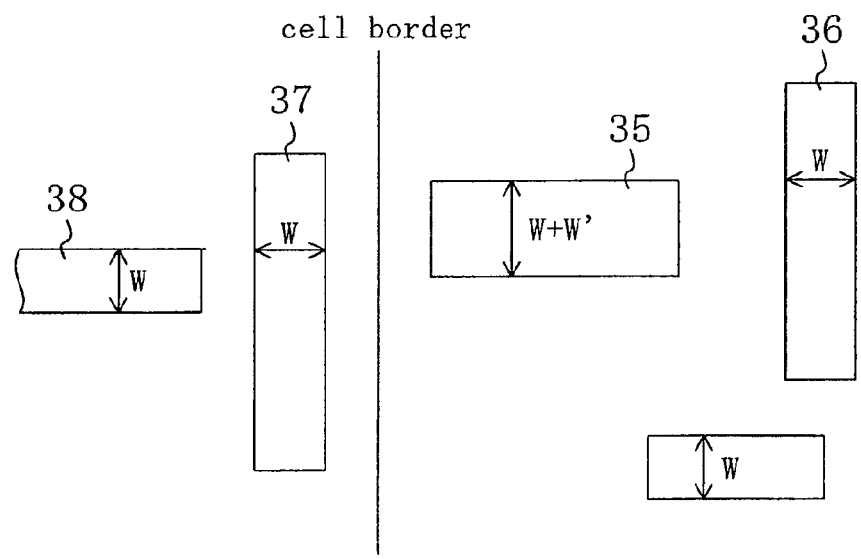
FIG. 9 is a diagram illustrating another example of the wiring pattern according to the third embodiment.
Figure 10:
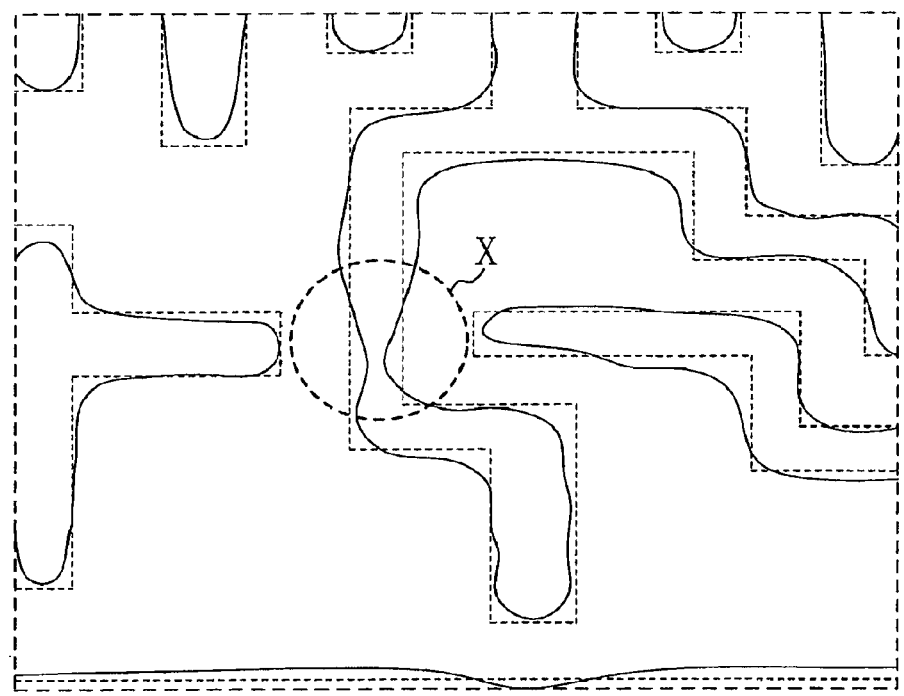
FIG. 10 is a diagram illustrating an example of attenuation in a wire disposed between ends of wires.

FIG. 9 is a diagram illustrating another example of a wiring pattern in the vicinity of a cell border according to this embodiment. FIG. 9 shows a wiring pattern in a certain wiring layer. In FIG. 9, a signal wire 35 (first signal wire) is adjacent to a cell border and extends in a direction perpendicular to the cell border. The signal wire 35 has an enlarged width of W+W'. That is, the signal wire 35 has a width larger than that of other signal wires, such as a signal wire 36 (second signal wire). The signal wire 35 preferably has the largest width among the signal wires in the standard cell.

With this structure, even in a case where a signal wire 37 in an adjacent standard cell is disposed between a signal wire 38 in the adjacent standard cell and the signal wire 35, light interference to the signal wire 37 during exposure is inhibited because the signal wire 35 has a wider width. Attenuation of the signal wire 37 is thus prevented.

The features of the present invention may be confirmed by, for example, checking design data of a standard cell.

What is claimed is:

1. A standard cell for forming a semiconductor device, the standard cell having a wiring pitch of 170 nm or less, comprising:
a first signal wire formed in a first wiring layer and extending in a first direction; and
second and third signal wires formed in the first wiring layer and extending in a second direction substantially perpendicular to the first direction, the second and third signal wires facing each other across the first signal wire,
wherein at least one of the second and third signal wires has a width larger than a width of the first signal wire.

2. The standard cell according to claim 1, wherein at least one of the second and third signal wires has a largest width among signal wires in the standard cell.

3. The standard cell according to claim 1, wherein both of the second and third signal wires have a width larger than the width of the first signal wire.

4. A semiconductor device comprising the standard cell of claim 1.

* * * * *